(12) United States Patent
James et al.

(10) Patent No.: US 7,501,309 B2
(45) Date of Patent: Mar. 10, 2009

(54) STANDOFFS FOR CENTRALIZING INTERNALS IN PACKAGING PROCESS

(75) Inventors: Stephen L James, Boise, ID (US); Vernon M Williams, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 11/511,955

(22) Filed: Aug. 29, 2006

(65) Prior Publication Data

US 2006/0292750 A1 Dec. 28, 2006

Related U.S. Application Data

(62) Division of application No. 10/799,296, filed on Mar. 12, 2004, which is a division of application No. 10/132,834, filed on Apr. 25, 2002, now Pat. No. 7,323,767.

(51) Int. Cl.
*H01L 21/00* (2006.01)

(52) U.S. Cl. ...................................... 438/106

(58) Field of Classification Search .................. 438/48, 438/106–109, 116; 257/734–738, E23.066, 257/E21.499
See application file for complete search history.

(56) References Cited

U.S. PATENT DOCUMENTS

| | | | |
|---|---|---|---|
| 5,139,969 A | 8/1992 | Mori | |
| 5,506,756 A | 4/1996 | Haley | |
| 5,550,711 A | 8/1996 | Burns et al. | |
| 5,579,208 A | 11/1996 | Honda et al. | |
| 5,665,653 A | 9/1997 | Bare et al. | |
| 5,700,715 A | 12/1997 | Pasch | |
| 5,729,051 A | 3/1998 | Nakamura | |
| 5,750,423 A | 5/1998 | Ishii | |
| 5,766,972 A | 6/1998 | Takahashi et al. | |
| 5,835,355 A | 11/1998 | Dordi | |
| 5,926,371 A | 7/1999 | Dolbear | |
| 6,048,755 A | 4/2000 | Jiang et al. | |
| 6,122,171 A | 9/2000 | Akram et al. | |
| 6,133,630 A | 10/2000 | Fogal et al. | |
| 6,144,101 A | 11/2000 | Akram | |
| 6,211,563 B1 | 4/2001 | Tzu | |
| 6,287,503 B1 | 9/2001 | Thummel | |
| 6,294,824 B1 | 9/2001 | Brooks et al. | |
| 6,310,390 B1 | 10/2001 | Moden | |
| 6,316,289 B1 | 11/2001 | Chung | |
| 6,329,220 B1 | 12/2001 | Bolken et al. | |
| 6,358,773 B1 | 3/2002 | Lin et al. | |
| 6,406,988 B1 | 6/2002 | Chung | |
| 6,432,749 B1 | 8/2002 | Libres | |
| 6,518,678 B2 | 2/2003 | James et al. | |

(Continued)

*Primary Examiner*—Nathan W Ha
(74) *Attorney, Agent, or Firm*—Whyte Hirschboeck Dudek SC

(57) ABSTRACT

A semiconductor device, semiconductor die package, mold tooling, and methods of fabricating the device and packages are provided. In one embodiment, the semiconductor device comprises a pair of semiconductor dies mounted on opposing sides of a flexible tape substrate, the outer surfaces of the dies having one or more standoffs disposed thereon. The standoffs can be brought into contact with an inner surface of the mold plates of a mold tooling when the device is positioned between the mold plates to maintain the flexible tape substrate in a centralized position within a mold chamber and inhibit the tape from bending as a molding compound flows into the chamber during encapsulation.

32 Claims, 14 Drawing Sheets

U.S. PATENT DOCUMENTS

| | | |
|---|---|---|
| 6,534,859 B1 | 3/2003 | Shim et al. |
| 6,559,525 B2 | 5/2003 | Huang |
| 6,847,527 B2 | 1/2005 | Sylvester et al. |
| 7,122,906 B2 | 10/2006 | Doan |
| 7,253,028 B2 * | 8/2007 | Liu .............................. 438/116 |
| 2001/0006251 A1 | 7/2001 | Miyaki et al. |
| 2002/0020916 A1 | 2/2002 | Ito |
| 2002/0050638 A1 | 5/2002 | Fogal et al. |
| 2002/0084538 A1 | 7/2002 | James et al. |
| 2003/0037947 A1 | 2/2003 | Chiu |
| 2003/0148597 A1 | 8/2003 | Tan et al. |
| 2003/0168725 A1 | 9/2003 | Warner et al. |
| 2003/0173679 A1 | 9/2003 | Levardo et al. |
| 2003/0183909 A1 | 10/2003 | Chiu |
| 2004/0075162 A1 | 4/2004 | Boyer et al. |
| 2004/0095727 A1 | 5/2004 | Houle |
| 2006/0118925 A1 | 6/2006 | Macris et al. |

\* cited by examiner

STANDOFFS FOR CENTRALIZING INTERNALS IN PACKAGING PROCESS

CROSS REFERENCE TO RELATED APPLICATION

The present application is a division of U.S. patent application Ser. No. 10/799,296, filed on Mar. 12, 2004, which is a division of U.S. patent application Ser. No. 10/132,834, filed on Apr. 25, 2002, presently U.S. Pat. No. 7,323,767.

FIELD OF THE INVENTION

This invention generally relates to assembling and packaging semiconductor dies, and more particularly to a ball grid array (BGA) package-type semiconductor device using a tape carrier, and a method for fabricating the device.

BACKGROUND OF THE INVENTION

In semiconductor package designs, semiconductor dies are mounted onto a substrate, and then encapsulated in a mold cavity. Support substrates such as bismaleimide-triazin (BT) resin, FR-4 board, ceramics, and metal leadframe (e.g., Alloy42 or copper) are inflexible and maintain their rigidity inside a mold cavity during encapsulation. A useful substrate is a flexible polyimide tape. Metal traces are formed on the upper side and underside of the support substrate, and vias are formed through the substrate to interconnect the metal traces on either side. The traces can include pads for wire bonding bond wires to the die, and ball bonding pads for attaching external ball contacts such as solder balls to the underside of the substrate. Dies are typically mounted onto the upper surface of the substrate via solder bumps or balls, or by means of an adhesive paste or double-sided tape.

Encapsulating dies mounted on a flexible tape substrate can be problematic. When positioned in a mold tooling, as a molding compound flows into the mold chamber and around the mounted die, the flexible tape can flutter and become warped or bent resulting in a bowed die structure, and an uneven layer of encapsulant formed around the die structure, which can lead to structural failure.

In view of these and other deficiencies, improvements in die packaging and fabrication processes are desirable.

SUMMARY OF THE INVENTION

The present invention provides a semiconductor device, semiconductor die packages, a mold tooling, and methods of fabricating the device and packages.

In one aspect, the invention provides a semiconductor device. In one embodiment, the semiconductor device comprises a semiconductor die having one or more standoffs disposed on a first surface. The semiconductor die can further include conductive balls disposed on the second surface in a ball grid array for flip-chip mounting the die onto a support substrate. In another embodiment, the semiconductor device comprises a pair of semiconductor dies mounted on opposing sides of a support substrate, the outer surfaces of the dies having one or more standoffs disposed thereon. The dies can be mounted onto the support substrate, for example, by a flip-chip attachment, or with an adhesive element. Exemplary support substrates include BT resin, FR-4 laminate, and polyimide tape, among others.

The standoff(s) provide a raised structure for spacing the dies from the inner surface of a mold plate when the device is positioned in a mold chamber of a mold tooling during encapsulation. The standoff(s) can be in a variety of shapes or forms. Exemplary standoffs include shaped objects such as a cylindrical, conical, or square shaped objects; materials in a graphic design such as a numeral, a letter and/or a logo, among others; pre-formed structures mounted on the surface of the die; a material applied to the die surface, for example, by screen printing, stenciling, electroplating, or other suitable method of attachment or formation; among others. The standoff(s) preferably comprise a flexible material. The standoff(s) function to maintain the substrate with the dies thereon in a centralized and substantially planar orientation within a mold chamber during encapsulation, and are particularly useful in maintaining a flexible support substrate such as a polyimide tape in a centralized position within a mold chamber, and inhibiting the tape disposed between a pair of mold plates, from fluttering or bending as a molding compound flows into the chamber during an encapsulation process. The standoffs have a height sufficient to maintain the position and alignment of the semiconductor device between the mold plates during encapsulation to result in a device centered in the package.

In yet another embodiment, the semiconductor device comprises a semiconductor die mounted on one side of a support substrate, with the outer surfaces of both the die and the substrate having at least one standoff disposed thereon. When the device is positioned in a mold chamber between two mold plates, the standoffs on either side of the device have a height sufficient to maintain the support substrate in a centralized and substantially planar orientation between the mold plates within the chamber during an encapsulation process.

In another aspect, the invention provides a semiconductor die package. In various embodiments, the package comprises a semiconductor device according to the invention having standoff(s) disposed on a surface of a die mounted on a support substrate, and at least partially disposed within an encapsulating material. The package can further include external contacts disposed on the second surface of the substrate for attaching the package as a component to an external electrical apparatus or device. In one embodiment, the package comprises a semiconductor device comprising a pair of dies mounted on opposing sides of a support substrate such as a polyimide tape, with the support substrate about centrally positioned between the first and second surfaces of the package, and the standoff(s) extending from the surface of the dies to about the surfaces of the package.

In another aspect, the invention provides methods of fabricating the foregoing semiconductor dies and die packages.

In an embodiment of a method of fabricating a semiconductor device, the method comprises providing a support substrate having opposing surfaces; providing a pair of semiconductor dies, each having at least one standoff disposed on a surface; and mounting the dies on the opposing surfaces of the substrate, for example, by flip chip mounting. In another embodiment, the method further includes forming or attaching a standoff on the surface of the dies, for example, by dispensing a material on the surface of the die by screen printing, stenciling, coating, or other method; or affixing a prefabricated object to the die surface.

In another embodiment, the method of fabricating a semiconductor device comprises a tape-based process for producing semiconductor devices on a strip of tape, which can be subsequently separated from each other. In one embodiment, a tape structure is formed of a flexible tape such as a polyimide tape, and a series of semiconductor dies attached to the tape, the dies having standoff(s) disposed thereon or subsequently formed thereon. A succession of ball grid arrays, wires or other electrical connection systems can be located on the tape.

In an embodiment of a method of forming a die package, the method comprises providing a semiconductor device according to the invention comprising a pair of semiconductor dies mounted on opposing sides of a support substrate, with standoff(s) disposed on a surface of each die; positioning the semiconductor device within the molding chamber of a mold tooling, with the standoffs in contact with the inner surfaces of the mold plates; and flowing a molding compound into the molding chamber to at least partially encapsulate the semiconductor device, wherein the support substrate of the semiconductor device is maintained in a centralized and substantially planar orientation within the molding chamber as the molding compound is flowed thereabout. In another embodiment, the method includes fabricating the semiconductor device by providing a pair of semiconductor dies, each die having a standoff disposed on a first surface; and mounting the dies on opposing sides of a support substrate. The method can further include forming or disposing the standoff(s) on the surface of the dies.

In another aspect, the invention provides a mold tooling for fabricating a semiconductor die package. In one embodiment, the mold tooling comprises a pair of molding plates and a molding chamber disposed therebetween, each of the molding plates having an inner surface having at least one standoff disposed thereon, the standoff having a height effective to restrict vertical movement of the die mounted on a support substrate such as a polyimide tape within the molding chamber during an encapsulation process and maintain the die and substrate in a centralized position within the mold. The standoffs can be molded or stamped into the inner surface of the mold plates, for example. The mold plates can also comprise a thermoformed material with the standoffs formed on the inner surfaces. In other embodiments, the standoffs can comprise a pre-formed structure affixed to the inner surface of the mold plates, or an electroplated material, for example.

The invention advantageously facilitates forming die packages comprising semiconductor dies mounted on a flexible tape support substrate, particularly on opposing sides of a tape substrate, by preventing the tape substrate from bending during the encapsulating process, to form a die package in which the tape substrate is centrally positioned within the package. The invention is also useful with semiconductor devices having dies mounted on more rigid materials such as a BT resin material. The invention also provides a means for package marking and identification.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 14-15 show the two dies being mounted onto the support substrate. FIG. 16 shows the die mounted on the substrate within the cavity of a molding tool.

FIG. 17 is a plan view of the panel showing the upper sides of the die packages. FIG. 18 is a plan view of the panel showing the undersides of the die packages. FIG. 19 is a cross-sectional, side elevational view of the panel of FIG. 17 taken along line 19-19. FIG. 20 is a side elevational view of the panel of FIG. 17 taken along line 20-20. FIG. 21 is an end view of the panel of FIG. 20 taken along line 21-21.

DETAILED DESCRIPTION OF THE PREFERRED EMBODIMENT

The invention will be described generally with reference to the drawings for the purpose of illustrating embodiments only and not for purposes of limiting the same.

Figure 1:
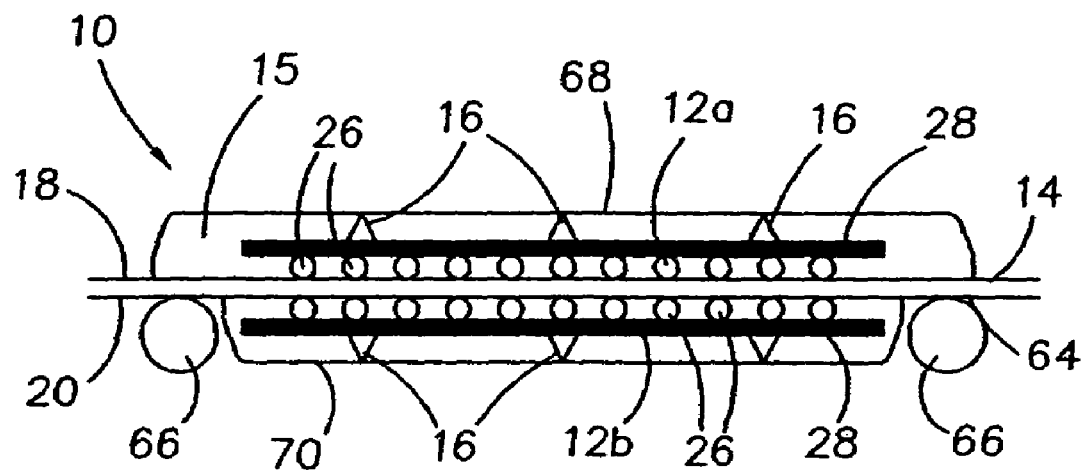
FIG. 1 is a cross-sectional, side elevational view of an embodiment of an encapsulated die package according to the invention.

Referring to FIG. 1, a first embodiment of a semiconductor die package 10 according to the invention is depicted. As shown in a cross-sectional, side elevational view, the package 10 comprises two semiconductor dies 12a, 12b that are flip chip mounted on opposite sides of an interposer or support substrate 14, and encapsulated by a molding compound (plastic casing) 15. A plurality of standoffs 16 is disposed on the outer surfaces of the dies 12a, 12b.

In the illustrated embodiment, the support substrate 14 is formed of a flexible material such a flexible polyimide film or tape (e.g., KAPTON brand film from DuPont, Wilmington, Del., or UPILEX from Ube Industries, Ltd., Japan). In other embodiments, the support substrate 14 can be formed of a more rigid material, for example, a known electrically insulating polymer material such as bismaleimide triazine (BT) resin or epoxy resins such as FR-4 or FR-5 laminates, a ceramic material, metal clad fiber board, or a metal leadframe (e.g., Alloy42 or copper), among other substrates. A representative thickness of the substrate is about 50 µm to about 500 µm. For exemplary purposes, the present embodiment will be described with respect to a flexible tape substrate.

Figure 2:
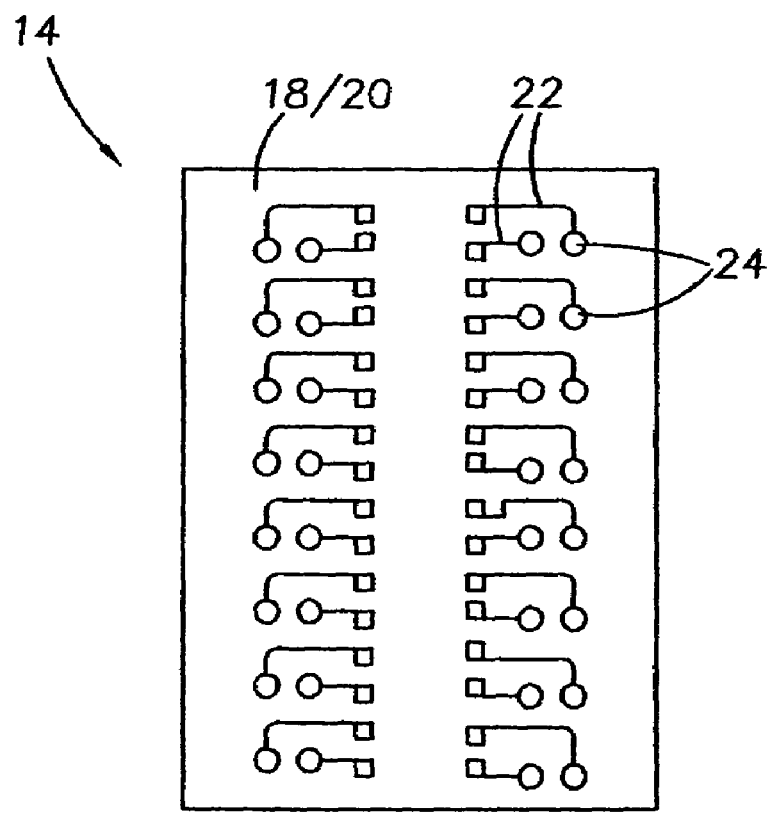
FIG. 2 is a plan view of the upper side (or underside) of the support substrate of the die package of FIG. 1.

FIG. 2 depicts an embodiment of the upper side 18, and likewise the underside 20, of the flexible tape substrate 14. As shown, electrically conductive traces 22 of copper or aluminum for example, are formed on the upper side 18 and underside 20 of the substrate 14 by a plating or etching method, for example, and protected by a resist. Vias (not shown) are formed in the support substrate 14 to interconnect the metal traces 22 on either side 18, 20 of the substrate 14. The traces 22 can include, for example, wire bonding pads for wire bonding bond wires to the die, and ball bonding pads for attaching external ball contacts such as solder balls to the underside of the substrate. In the illustrated embodiment, the traces 22 on either side of the flexible tape support substrate 14 include ball bonding pads 24 in a FBGA arrangement for attaching the solder balls of the semiconductor die 12a, 12b thereto. Signals are routed through the traces to the die via the solder ball connections.

A variety of semiconductive dies can be mounted onto the support substrate 14, and the invention will work with flip chip or wire bond arrangements. In the illustrated embodiment, two semiconductor dies 12a, 12b have been flip-chip bonded (active surface down) to opposing sides 18, 20 of a flexible tape substrate 14 through a plurality of conductive balls or bumps 28 comprising solder or polymer with an electrically conductive capability, e.g., conductive epoxy or conductor-filled epoxy. Flip chip connections mechanically and electrically connect dies to carriers, as is well known in the art.

Figure 3:
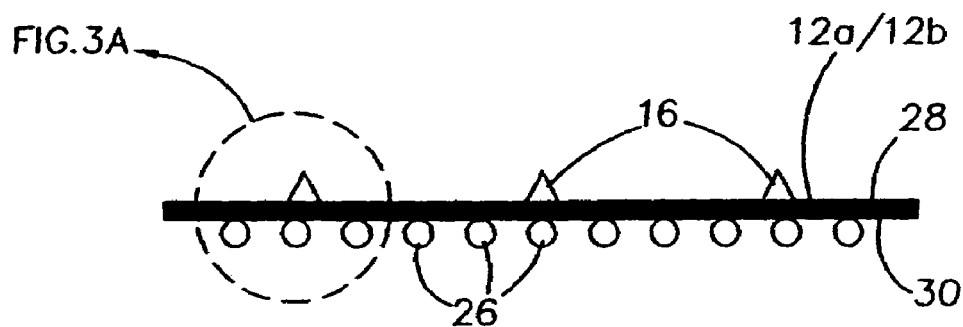
FIG. 3 is a cross-sectional, side elevational view of the dies shown in FIG. 1.
Figure 4:
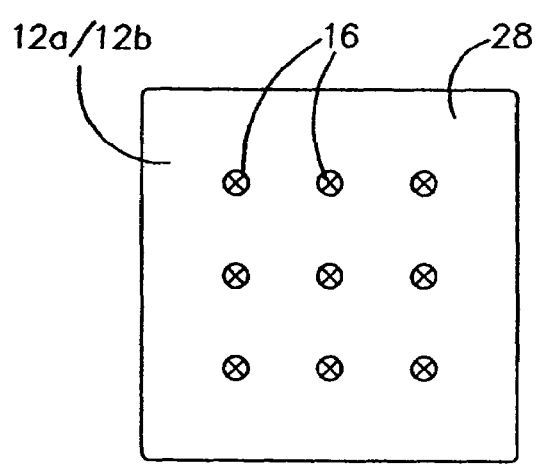
FIG. 4 is a plan view of the upper side of the die of FIG. 3, showing the standoffs.
Figure 5:
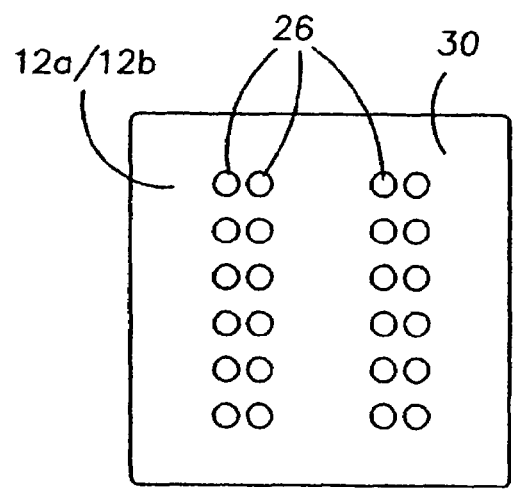
FIG. 5 is a plan view of the underside of the die of FIG. 3, showing the conductive bumps.

As depicted in FIGS. 3-5, the dies 12a, 12b include a first or upper side (inactive surface) 28 and a second or underside (active surface) 30. Conductive balls 26 are mounted in a ball grid array on the underside 30 of the dies.

The conductive balls 26 on the underside 30 of the dies 12a, 12b, can be arranged in one or more rows (FIG. 5), or the balls can be provided in non-linear arrangements. The conductive balls 26 can be in the form of solder balls, typically formed of tin (Sn) and/or lead (Pb), or a conductive material such as a conductive epoxy or conductor-filled epoxy. The conductive solder balls of a BGA device can be attached to ball bonding pads on a die surface or substrate surface using conventional surface mount processes and equipment, and, in the case of solder balls, reflowed in place using an infrared or hot air re-flow process. The conductive balls are electrically and mechanically connected to the ball mounting pads and conductive elements of the die or substrate.

A solder mask (not shown) can be disposed around the solder balls to protect the integrated circuit, strengthen the solder joints, and prevent solder from cross-flowing and creating a short circuit between solder joints.

Figure 3A:
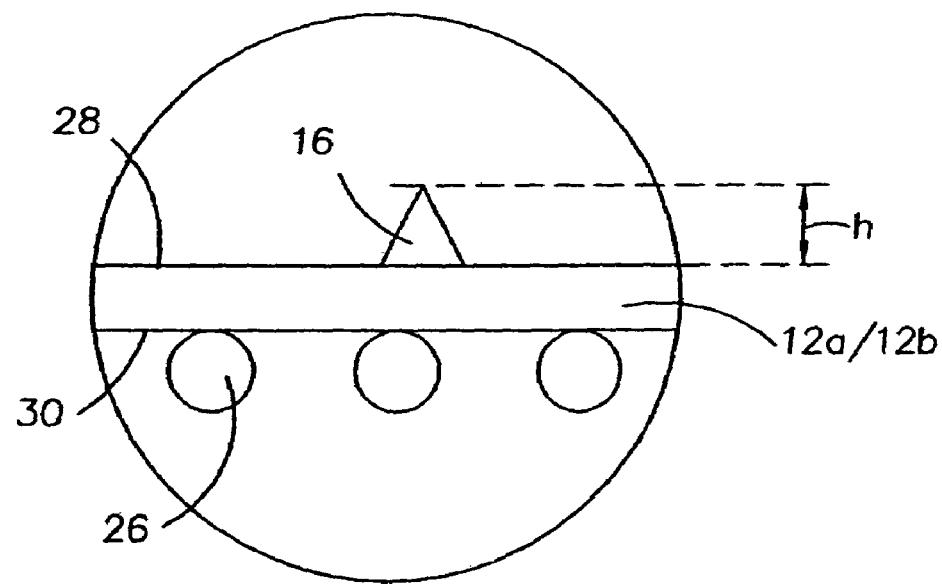
FIG. 3A is an enlarged section of the die of FIG. 3.

According to the invention, one or more protrusions or standoffs 16 are disposed on the upper side 28 of the dies to provide a raised structure or spacer. In the embodiment depicted in FIGS. 1 and 3-4, a plurality of conical shaped standoffs 16 are disposed on the upper (inactive) surface 28 of each of the dies 12a, 12b. Referring to FIG. 3A, the standoff(s) 16 have a height (h) sufficient to limit or restrict the vertical movement (arrow 54, FIG. 16) of the die/substrate assembly 55 within a mold cavity during an encapsulation process.

Figure 6:
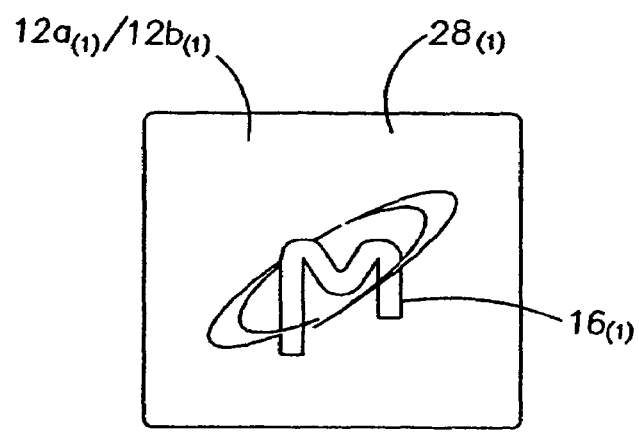
FIG. 6 is another embodiment of a standoff disposed on the surface of a die according to the invention.

The standoff(s) 16 can be applied to or formed on the die surface 28 at an appropriate processing step prior to placement of the die in a mold tooling. The standoff(s) 16 can be in any desired shape, for example, cylindrical, conical, square, rectangular, hemispherical, spherical, tubular, among others, or a pattern or motif such as a numeral, letter, logo (e.g., letter logo $16_{(1)}$ as depicted in FIG. 6), or other graphic design.

The standoff(s) 16 can be fabricated from a variety of materials that are compatible with the die surface and the encapsulating material. Exemplary materials for forming the standoff(s) include plastic materials such as acrylics, polyamides, polyethylene terephthalate (PET), polyethylene, polypropylene, polystyrene, poly(vinyl chloride) resins, polycarbonates, and polyurethanes, among others; and conventional potting or molding compounds, as well as glob top encapsulants that can be cured, set, or dried from a viscous or liquid state to a stable-dimensioned, hardened yet flexible mass, for example, a thermoset epoxy resin such as a novolac epoxy resin-based compound, among others.

In another embodiment, the standoff(s) can be fabricated to also function a heat sink for dissipating heat generated by the die during operation. In such form, the standoff(s) 16 comprise a thermally conductive material, such as copper, aluminum, gold, silver, or nickel, for example. Such materials can be deposited on to the surface 28 of the die 12a, 12b by electroplating or anodizing, for example, or can be attached as a foil sheet (e.g., copper foil) or other form.

Figure 7:
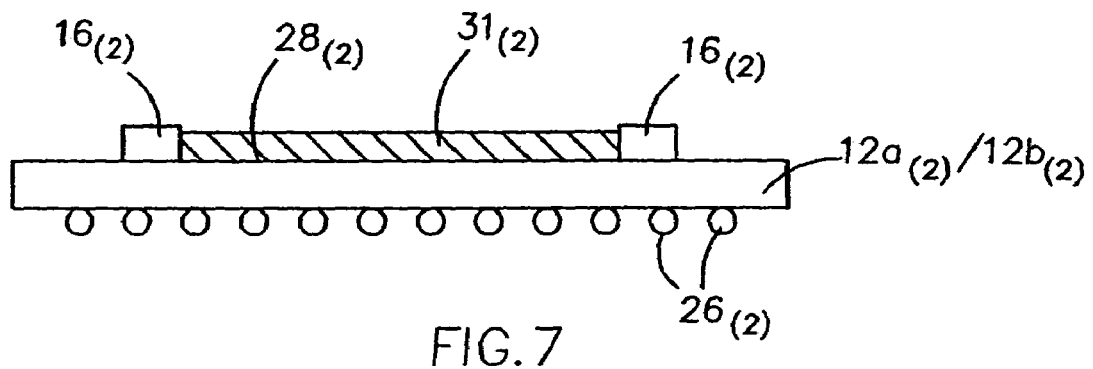
FIG. 7 is cross-sectional, side elevational view of standoff disposed on the surface of a die, the standoff in the form of an enclosure to contain a heat sink, the view being taken along line 7-7 of FIG. 8.
Figure 8:
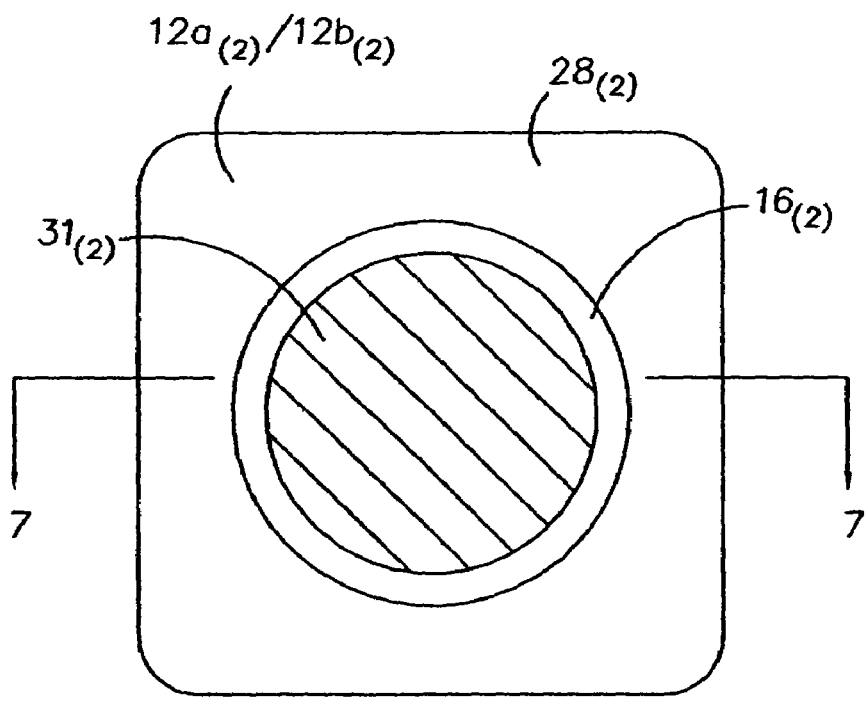
FIG. 8 is a plan view of the standoff of FIG. 7, containing a heat sink.
Figure 7A:
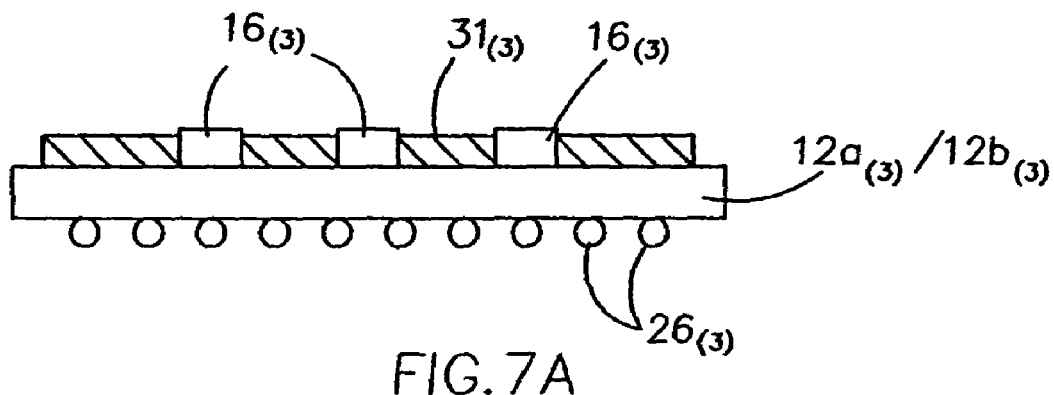
FIG. 7A is another embodiment of heat sink disposed about the standoffs on the surface of the die.
Figure 8A:
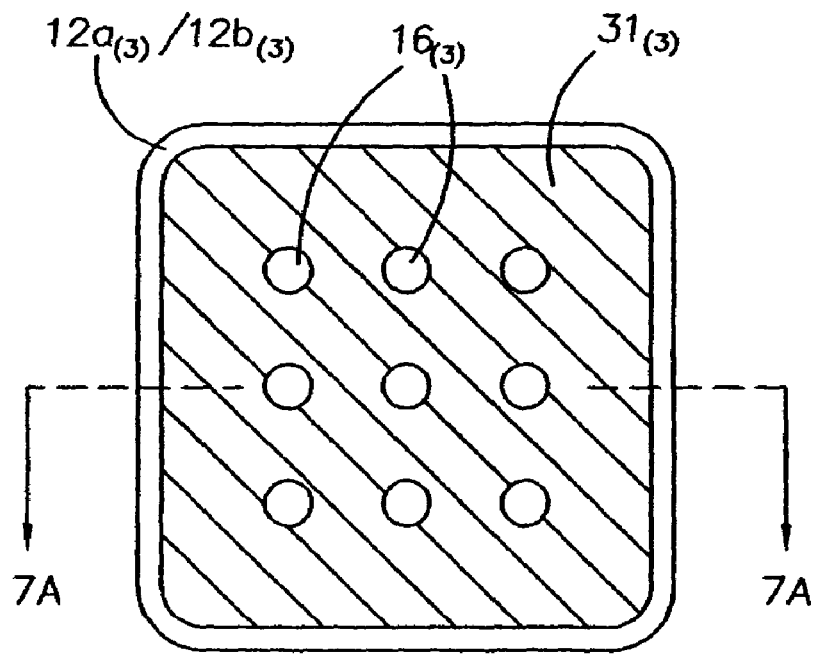
FIG. 8A is a plan view of the standoffs and heat sink of FIG. 7A.
Figure 9:
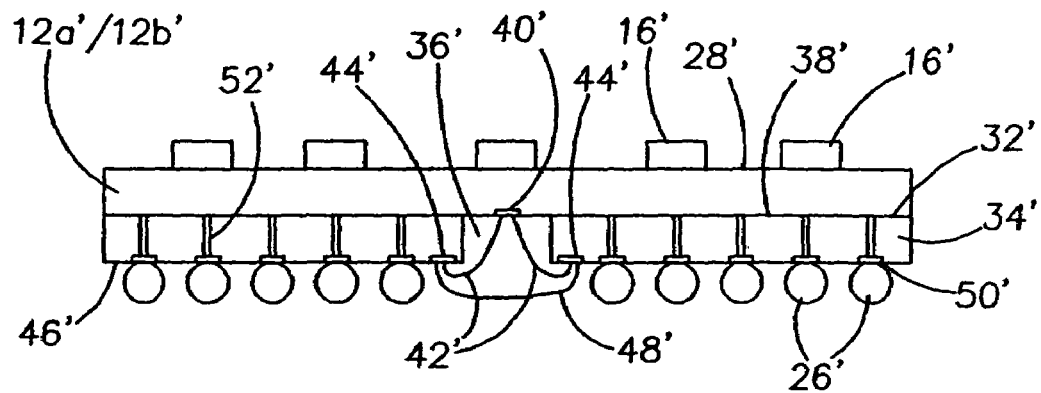
FIG. 9 is a cross-sectional, side elevational view of another embodiment of a die for fabricating a die package according to the invention.
Figure 10:
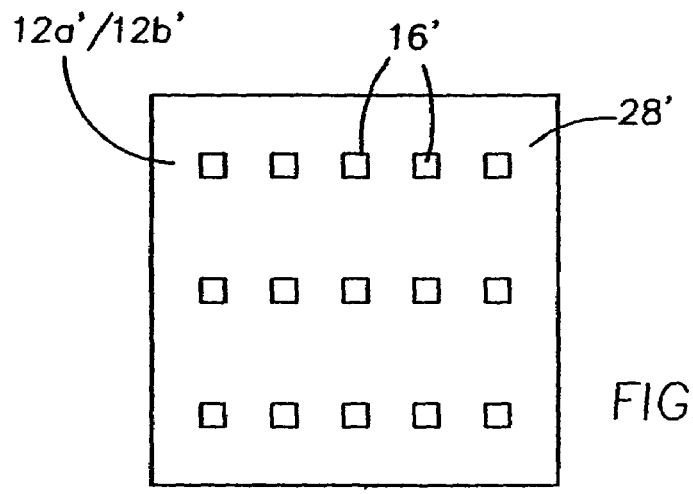
FIG. 10 is a plan view of the upper side of the die of FIG. 9, showing the standoffs.
Figure 11:
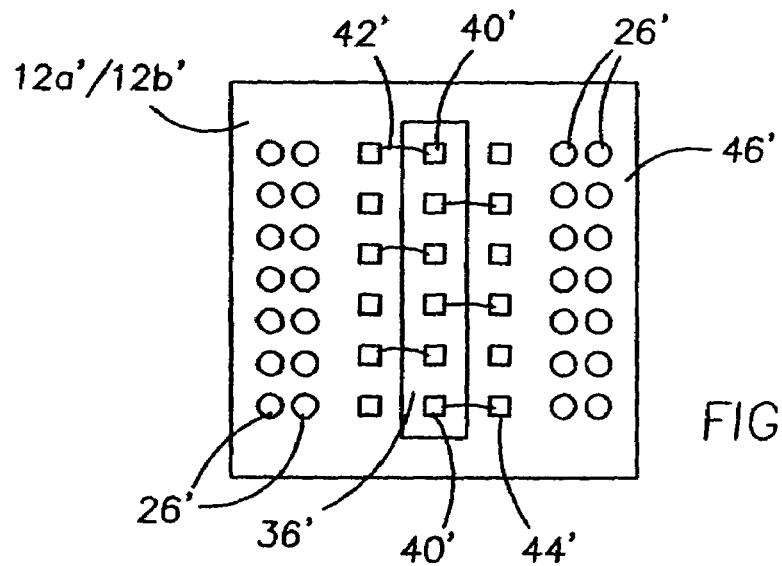
FIG. 11 is a plan view of the underside of the die of FIG. 9, showing the conductive bumps and the wire bond elements, with the glob top encapsulant removed.

Referring to FIGS. 7-8, in yet another embodiment, the standoff(s) $16_{(2)}$ can be fabricated to contain a heat sink $31_{(2)}$. The standoff(s) $16_{(2)}$ can be formed, for example of a plastic material, as a dam or other enclosure. As depicted, the standoff $16_{(2)}$ has been formed as a circular dam structure, although other shapes (e.g., triangular, oval, square, rectangular, and the like) can be utilized to form an enclosure. A thermally conductive material such as copper or aluminum, for example, can be deposited or applied to the upper surface $28_{(2)}$ of the die $12a_{(2)}$, $12b_{(2)}$ within the confines of the standoff(s) $16_{(2)}$ to form a heat sink $31_{(2)}$ for dissipating heat from the die $12a_{(2)}$, $12b_{(2)}$ during operation.

In another embodiment, a heat sink material $31_{(3)}$ can be disposed about the standoff(s) $16_{(3)}$ on the surface $28_{(2)}$ of the die $12a_{(3)}/12b_{(3)}$ as depicted in FIGS. 7A-8A. A thermally conductive material can be disposed on the surface of the die, for example, by masking and electroplating, by adhering a metal foil, among other methods.

The standoff(s) can be applied, for example, by a screen printing method, by stenciling, coating, masking, stamping, heat stamping, dispensing a flowable material using a liquid capillary, spray coating, direct spreading, affixing a preformed material using an adhesive (e.g., a cylindrical object, an adhesive-backed decal), electroplating, anodizing, or other method known and used in the art. The standoff(s) can be a prefabricated plastic, formed into a desired configuration, for example, by injection molding, extrusion, blow molding, compression molding, transfer molding, thermoforming, and among other methods. Useful adhesive materials for attaching the standoffs to the die surface are known in the art, and include contact adhesives, thermoplastic adhesives and thermosetting adhesives, for example, an adhesive gel or paste such as a conventional epoxy or polyimide die bonding adhesive, and/or a double-sided adhesive tape such as polyimide, and can be used to apply the standoff under pressure and/or heat.

Figure 12:
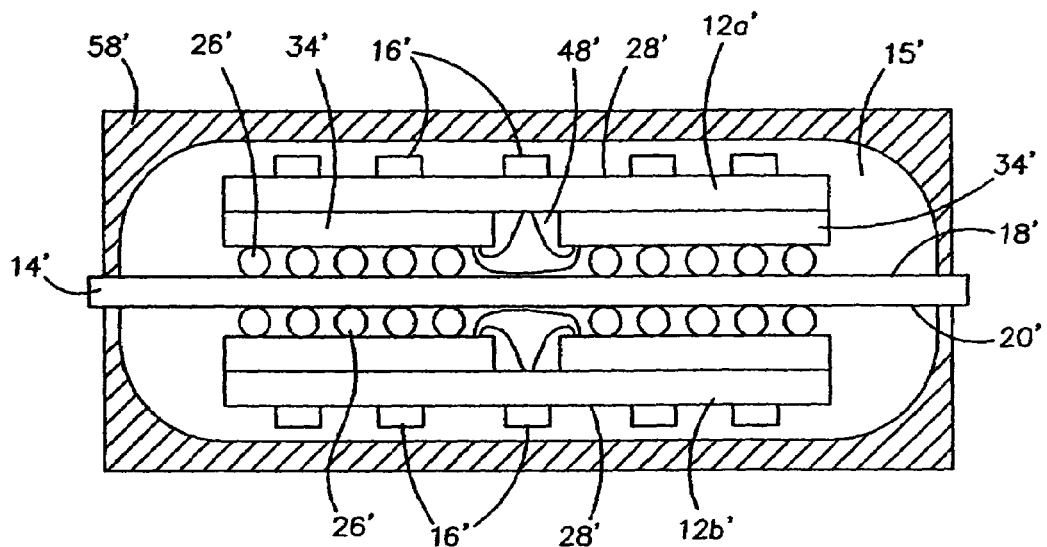
FIG. 12 is a cross-sectional, side elevational view of the die of FIG. 9 disposed on opposing sides of a support substrate, and positioned in a mold tooling.

In another example of a die construction and package illustrated in FIGS. 9-12, a semiconductor die 12a', 12b' can be mounted on the upper surface 32' of a support substrate 34' (e.g., polyimide tape, etc.) having an opening 36' formed by stamping, for example, using a dielectric adhesive 38' (e.g., paste or double-sided tape), or conductive bumps as described for FIGS. 3-5. The semiconductor die 12a', 12b' includes bond pads 40' electrically connected by wire bonds 42' to bond pads 44' on the underside 46' of the support substrate 34'. Following wire bonding, a glob top encapsulant material 48' can be deposited on the wired elements. Conductive elements 26' such as solder balls are attached or bonded to terminal ball bonding pads 50' of traces on the underside 46' of the substrate 34'. The semiconductor die 12a', 12b' is electrically coupled to the solder balls 26' through the conductive traces routed across the support substrate 34' and through vias 52' to the underside 46' of the support substrate 34'. Referring to FIG. 12, the dies 12a', 12b' can be flip-chip mounted to ball bonding pads of traces disposed on opposing sides 18', 20' of a flexible tape substrate 14' through the solder balls 26'. The dies 12a', 12b' includes one or more standoff(s) 16' disposed on the upper surface 28' of the die. The assembled dies 12a', 12b' and substrate 14' can then be positioned in a mold tooling 58" for encapsulation.

Figure 13:
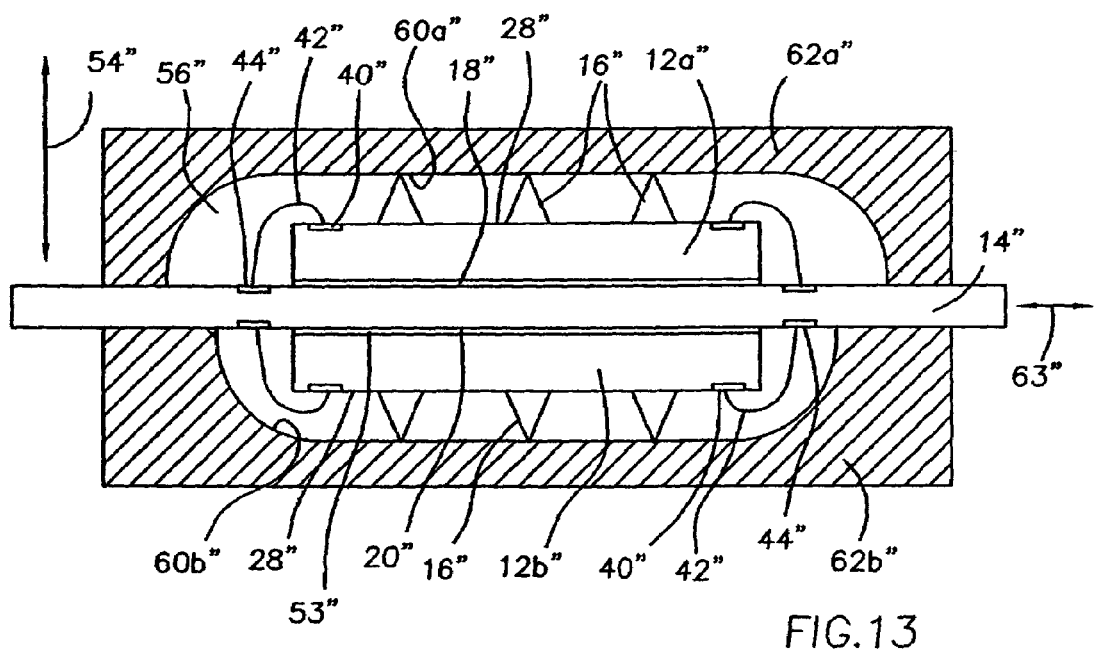
FIG. 13 is a cross-sectional, side elevational view of another embodiment of dies having standoffs and adhesively mounted and wire bonded to a support substrate, disposed in a mold tooling.

In yet another example of a semiconductor die assembly shown in FIG. 13. The dies 12a", 12b" are mounted on a substrate 14" using an adhesive element 53" such as a dielectric paste or double-side adhesive tape. Bond pads 40" on the upper side 28" of the dies are connected through bonding wires 42" to bond pads 44" on the support substrate 14". Standoffs 16" disposed on the upper side 28" of the dies 12a", 12b" have a height (h, FIG. 3A) sufficient to maintain the substrate 14" centrally positioned and in a substantially planar orientation (arrow 63") within the mold cavity 56" during an encapsulating process.

Figure 14:
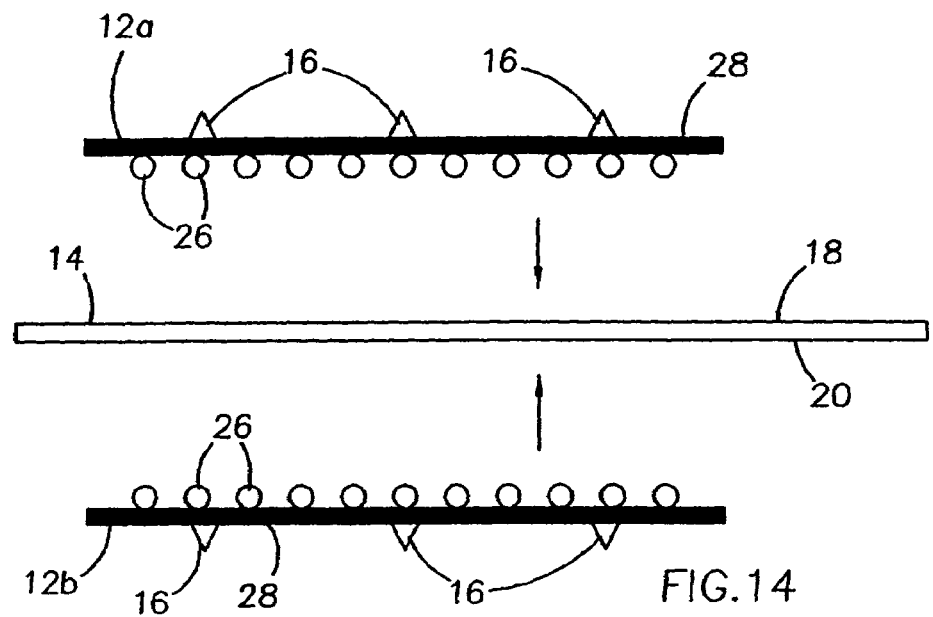
FIGS. 14-16 illustrates sequential processing steps showing fabrication of the die package of FIG. 1 according to an embodiment of a method of the invention.
Figure 15:
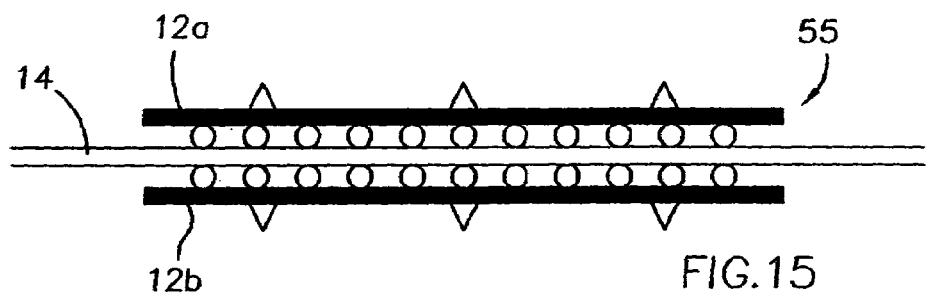
Figure 16:
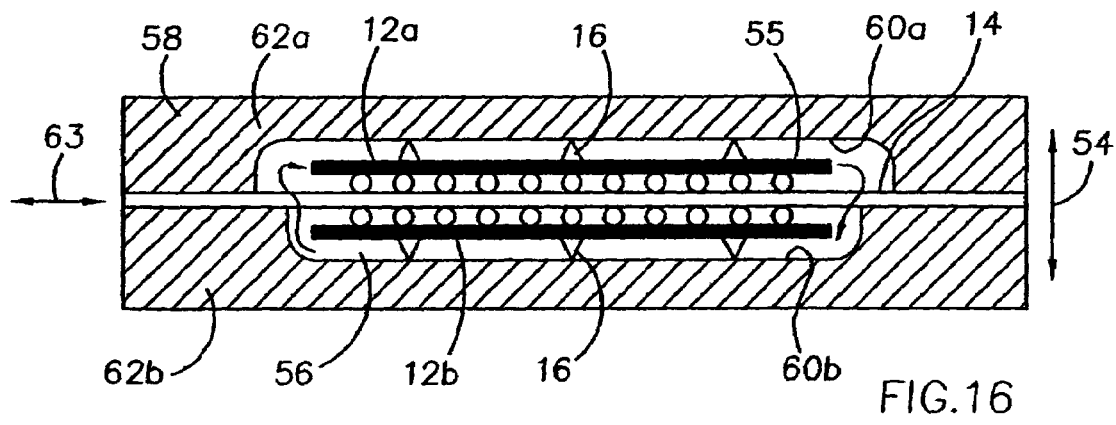
Figure 17:
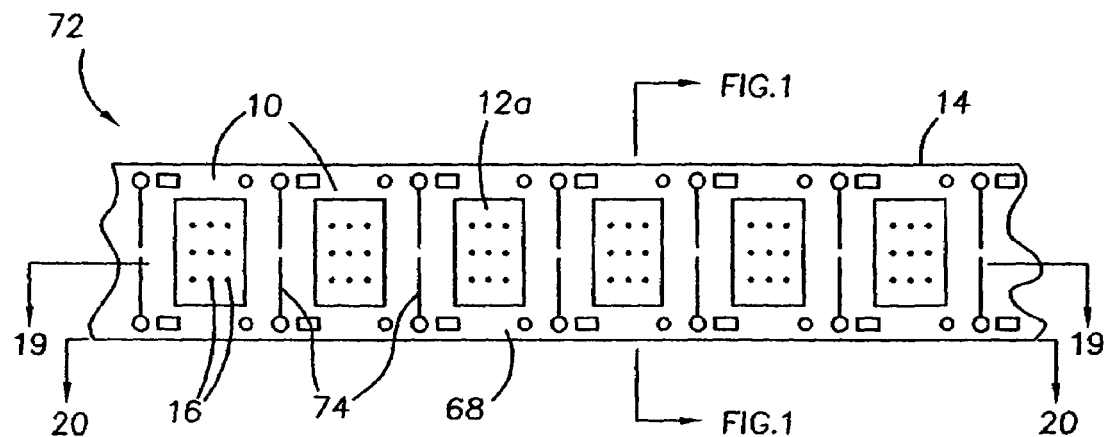
FIGS. 17-21 are views of a support substrate in the form of a panel with multiple die encapsulated and disposed on the panel substrate.
Figure 18:
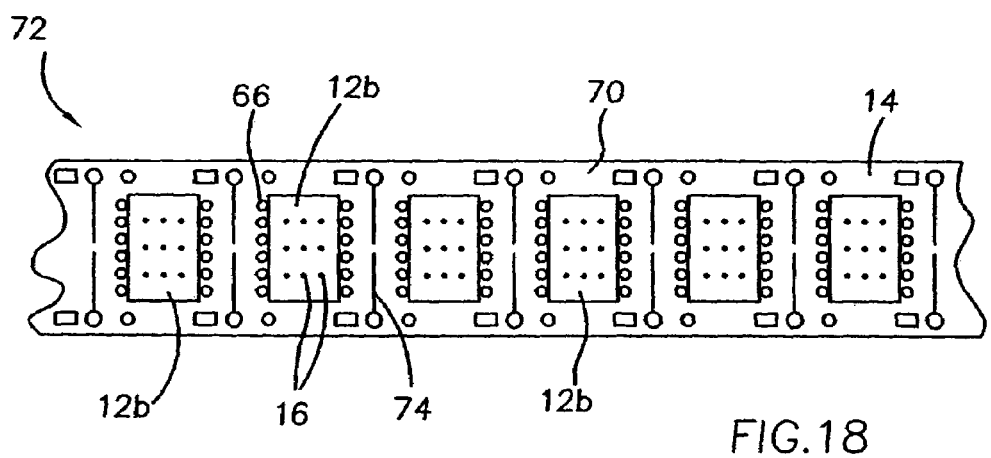
Figure 19:
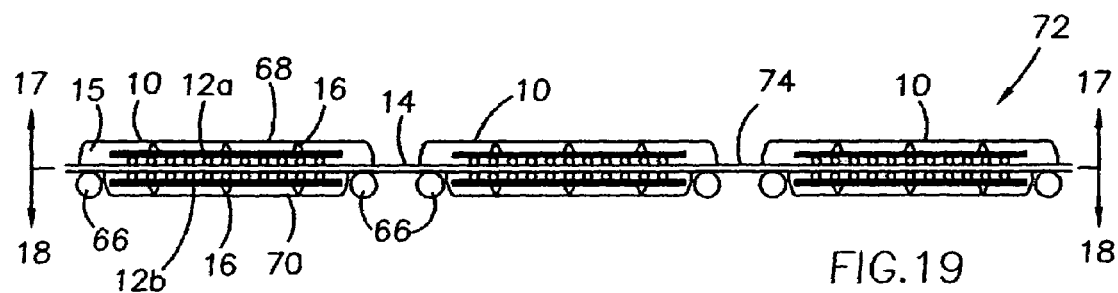
Figure 20:
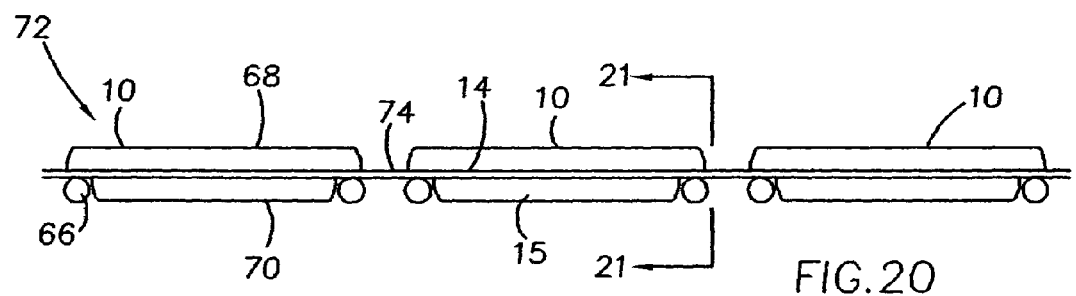
Figure 21:
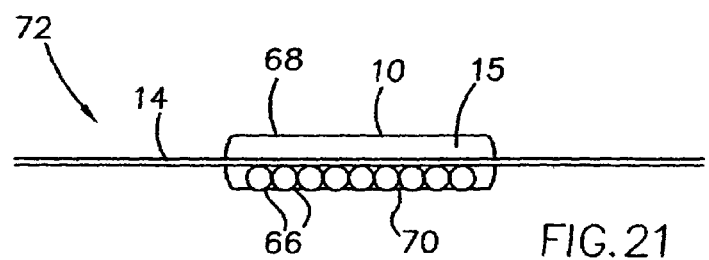

An embodiment of a method of assembling a BGA or FBGA die package as depicted in FIG. 1, can be described with reference to FIGS. 14-16. The illustrated BGA semiconductor dies 12a, 12b can be fabricated by known techniques. Standoffs 16 are formed or mounted on the upper side 28 of the dies. The dies 12a, 12b are flip chip mounted on opposite sides 18, 20 of the flexible tape substrate 14 by mounting and reflowing the solder balls 26 on ball pads of the trace wiring, or cured in the case of conductive polymer bumps, although other methods such as thermal compression can also be used. The die/substrate assembly 55 (FIG. 15) is then placed in the cavity 56 of a mold tooling 58 with the standoffs 16 positioned toward the inside surfaces 60a, 60b of the mold plates 62a, 62b, as depicted in FIG. 16. The standoffs 16 need not contact the mold plates initially, but have a minimum height (h) to contact the plates as a molding compound is flowed about the die/substrate assembly 55, and prevent the substrate 14 from warping or bowing during the encapsulation process. Encapsulation then proceeds whereby a molding compound such as a novolac epoxy resin-based compound is flowed (arrows) into the mold cavity 56 and around the dies and support substrate, and allowed to cure to form a plastic casing 15 (FIG. 1). The encapsulated die/substrate assembly 55 is then removed from the mold tooling 58. Advantageously, the standoffs 16 maintain the dies 12a, 12b and substrate 14 centralized and in a substantially planar orientation (arrow 63) within the mold cavity 56 during encapsulation resulting in a device that is centered in the die package.

Referring to FIG. 1, a solder mask (not shown) can be applied to the underside 20 of the substrate 14 such that bonding pads 64 on the tape substrate 14 are exposed. External contacts 66 in the form of conductive solder balls, for example, are then attached to the bonding pads 64 on the tape substrate 14 by a conventional mounting method, for attaching the die package 10 to an external electrical apparatus (not shown). The flexible tape substrate 14 is then trimmed to finish the package. As shown in FIG. 1, the package has a first surface 68 and a second surface 70.

As shown in FIGS. 17-21, the support substrate 14 can be in the form of a strip or panel 72 having an indefinite length, on which multiple die packages 10 can be formed. The strip 72 can be subsequently cut along cut lines or an expansion slot 74 to separate the individual packages 10, and the flexible tape substrate 14 trimmed to finish the package.

Figure 22:
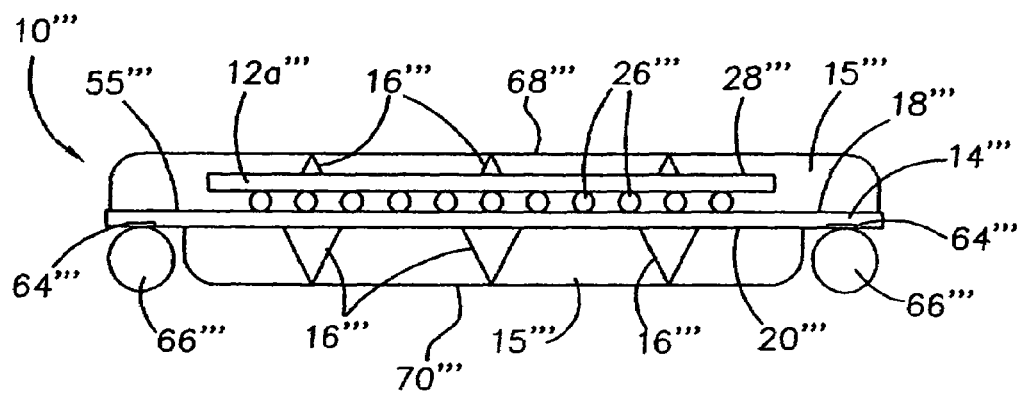
FIG. 22 is a cross-sectional, side elevational view of another embodiment of a semiconductor die package according to the invention, having a single die mounted on a support substrate.
Figure 23:
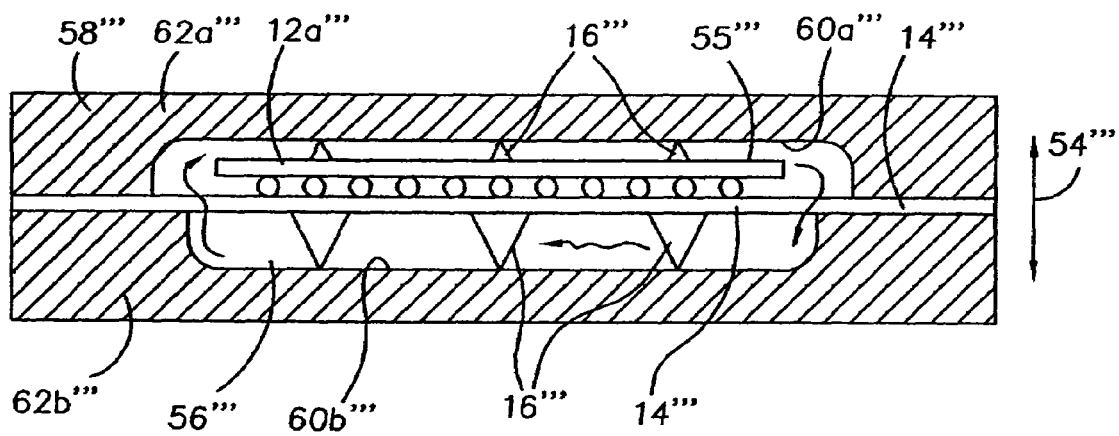
FIG. 23 is a cross-sectional, side elevational view of the die/substrate assembly shown in FIG. 22 positioned in the cavity of a molding tool.

Another embodiment of a semiconductor die package 10''' according to the invention is illustrated in FIG. 22. As shown, a semiconductor die 12a''' having standoffs 16''' disposed on an upper side 28''' is flip chip mounted via conductive bumps 26''' onto an upper side 18''' of a support substrate 14''' (e.g., flexible tape). The support substrate 14''' includes standoffs 16''' disposed on an opposing surface (underside) 20'''. Referring to FIG. 23, the standoffs 16''' are sized in height (h, FIG. 3A) to position and maintain the support substrate 14''' in a centralized and substantially planar orientation in a mold cavity 56''' and inhibit bending (e.g., vertical movement, arrow 54''') of the substrate 14''' as the molding compound (arrows) is flowed around the die structure during encapsulation. As shown in FIG. 22, the encapsulated die package 10''' further includes solder balls 66''' (or other conductive contact) mounted onto bonding pads 64''' of the traces on the underside 20''' of the support substrate 14''' for connection to an external device.

Figure 24:
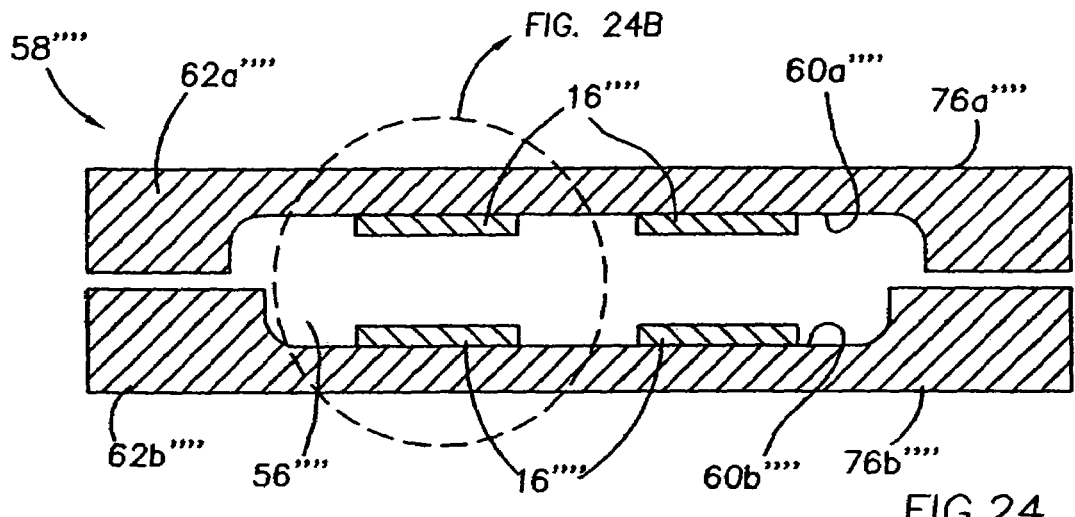
FIG. 24 is a cross-sectional, side elevational view of an embodiment of a molding tool according to the invention, having standoffs disposed on the inner surfaces of the molding plates.
Figure 24A:
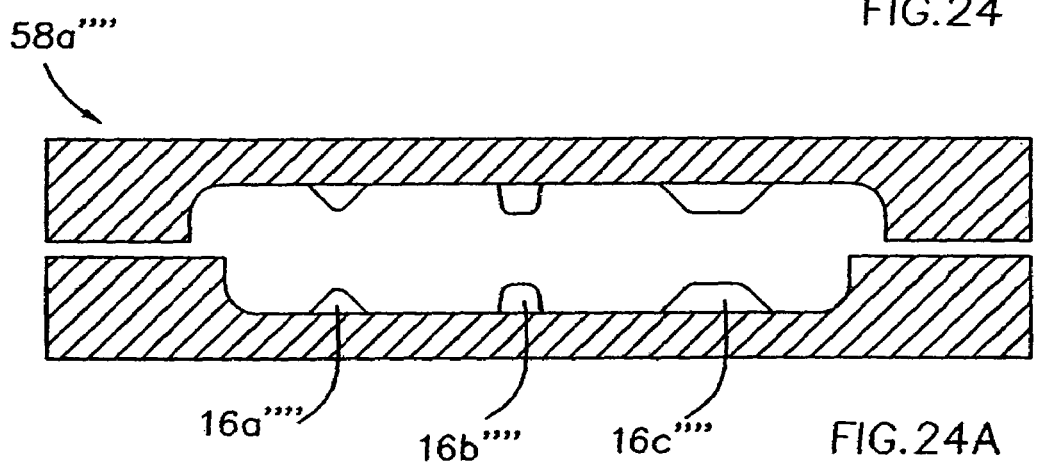
FIG. 24A is another embodiment of the molding tool showing different shaped standoffs.

In another embodiment of the invention, one or more standoff(s) can be integrally disposed on the inner surfaces of the mold plates 62a'''', 62b'''' of a mold tooling 58'''', as illustrated in FIGS. 24-27, rather than being disposed on the die itself. As shown in FIGS. 25A and 25B, a standoff 16'''', depicted in the form of a letter logo which is merely exemplary, has been affixed to the inner surfaces 60a'''', 60b'''' of the mold plates 62a'''', 62b''''. Referring to FIGS. 26A and 26B, in an embodiment of the mold tooling, the standoff 16'''' can be visible through the outer surfaces 76a'''', 76b'''' of the mold plates 62a'''', 62b''''. The standoffs 16''''provide a raised structure to restrict vertical movement 54'''' of the die/substrate assembly 55'''', particularly an assembly comprising a flexible tape substrate 14'''', within the mold cavity 56'''' during the encapsulating process. Standoff(s) integral to the mold tooling can have various shapes and sizes, as depicted, for example, in FIG. 24A illustrating standoffs 16a'''', 16b'''' and 16c''''.

The standoffs 16'''' can be formed on the mold plate surface 60a'''', 60b'''' similar to the fabrication of standoff(s) on the die surface as described with reference to the die package of FIG. 1. The mold plate can also be fabricated as a pre-molded or stamped lid with the standoff 16'' formed, for example, by thermoforming, stamping, and other like methods. A typical method of mold cavity formation is by electro-static discharge machining (EDM) methods, and the standoff features in a mold tooling can also be formed by EDM processing.

Figure 24B:
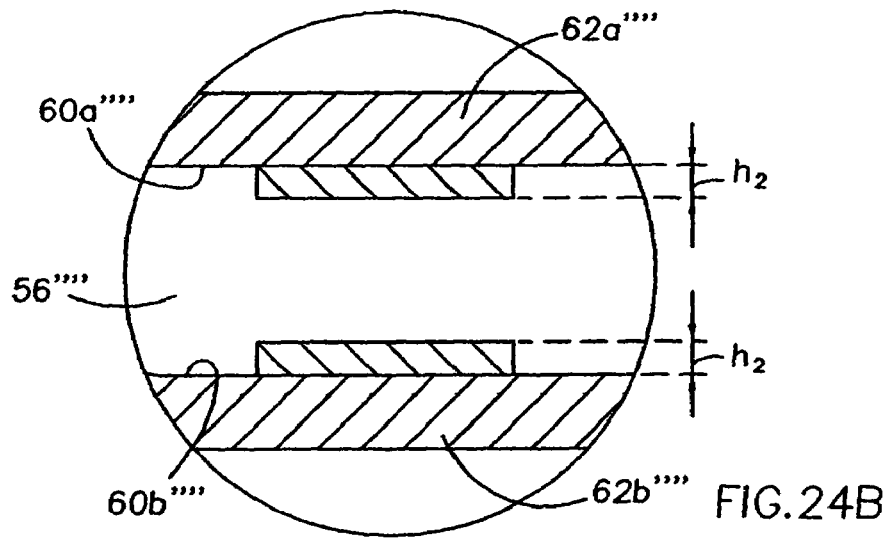
FIG. 24B is an enlarged section of the molding tool of FIG. 22, showing the height (h) of the standoffs.
Figure 25A:
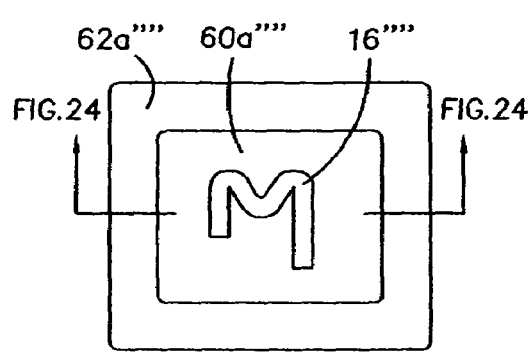
FIGS. 25A and 25B are plan views of the inner surfaces of the upper/lower molding plates, respectively, of the molding tool of FIG. 24.
Figure 25B:
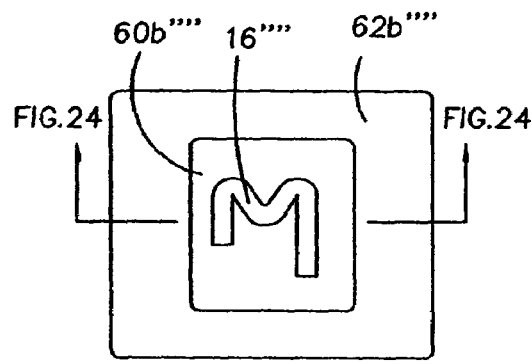
Figure 26A:
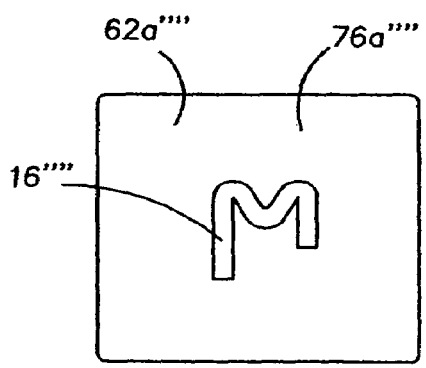
FIGS. 26A and 26B are plan views of the outer surfaces of the upper/lower molding plates, respectively, of the molding tool of FIG. 24.
Figure 26B:
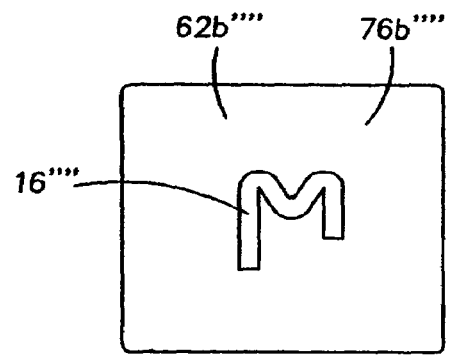
Figure 27:
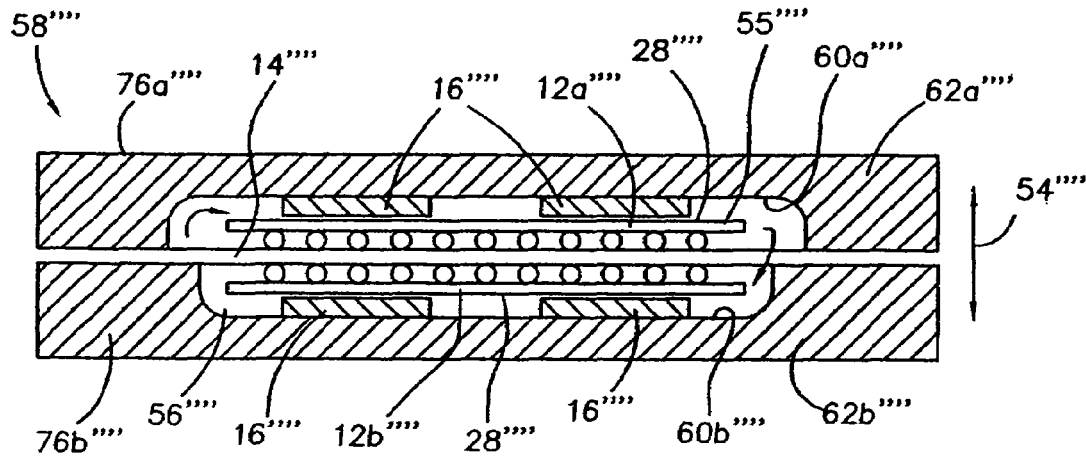
FIG. 27 is a cross-sectional, side elevational view of a die/substrate assembly positioned in the cavity of the molding tool of FIG. 24.
Figure 28:
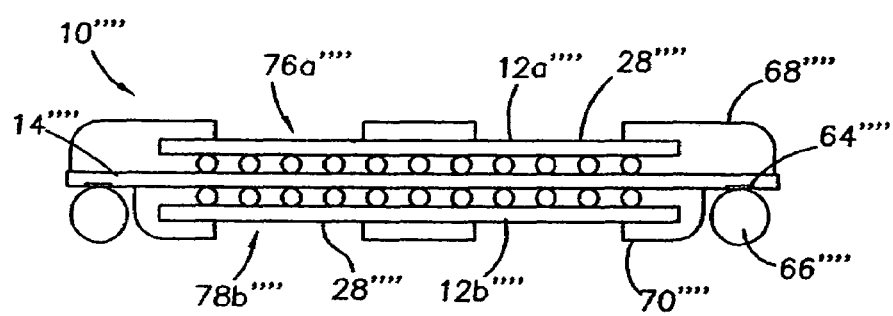
FIG. 28 is a side cross-sectional, side elevational view of a die package resulting from encapsulation using the molding tool of FIG. 24.
Figure 29A:
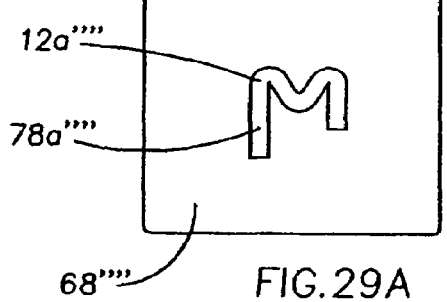
FIGS. 29A and 29B are plan views of the upper side and underside, respectively, of the die package of FIG. 28.
Figure 29B:
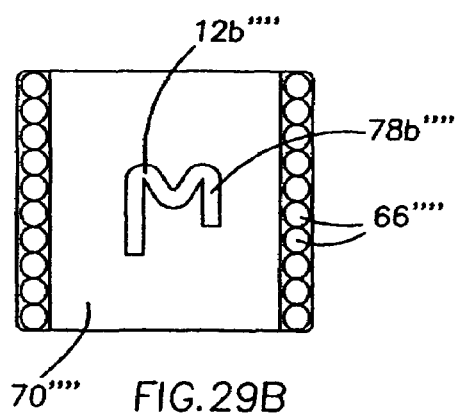

As depicted in FIGS. 24B and 27, the standoffs 16'''' have a height ($h_2$) sufficient to extend from the inside surface 60a'''', 60b'''' of the mold plate 62a'''', 62b'''' to contact the surface 28'''' of the dies 12a'''', 12b'''' mounted on a support substrate 14'''' during the encapsulation process, so as to maintain the substrate 14'''' in a centralized position and substantially planar orientation in the mold cavity 56''''. The resulting encapsulated die package 10'''' is removed from the mold tooling and, as shown in FIG. 28, external contacts 66'''' can be attached to pads 64'''' on the support substrate 14'''', and the substrate is trimmed. The contact of the standoff(s) 16'''' of the mold plates 62a'''', 62b'''' against the upper sides 28'''' of the dies 12a'''', 12b'''' reduces the encapsulant material on these portions of the die surfaces 28'''' such that when the die package is removed from the mold tooling, an impression 78a'''', 78b'''' of the standoffs 16'''' remains in the encapsulant layer and the surfaces 28'''' of the dies 12a'''', 12b'''' can be exposed, as depicted in FIGS. 28, 29A and 29B.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed:

1. A method of fabricating a die package, comprising:
   positioning a die mounted on a substrate within a molding chamber of a mold tooling comprising a pair of mold plates, the die having a standoff situated on a surface, wherein the standoff has a height effective to contact an inner surface of one of the mold plates during encapsulation of the die; and
   flowing a molding compound into the molding chamber to at least partially encapsulate the die, wherein the die and substrate are maintained in a substantially planar orientation within the molding chamber and only the standoff is in contact with said inner surface of one of the mold plates as the molding compound is flowed thereabout.

2. The method of claim 1, wherein the support substrate is flexible.

3. The method of claim 1, wherein the die is flip chip mounted on the substrate.

4. The method of claim 1, wherein the support substrate is flexible.

5. The method of claim 1, wherein the standoff is in the form of a dam.

6. The method of claim 5, wherein a thermally conductive material is situated on the surface of the die adjacent to the standoff.

7. The method of claim 1, wherein the standoff is in the form of an enclosure, and a thermally conductive material is situated on the surface of the die within said standoff enclosure.

8. The method of claim 1, wherein the substrate comprises a polyimide film.

9. The method of claim 1, wherein the substrate is rigid.

10. The method of claim 9, wherein the substrate comprises a material selected from the group consisting of a polymer material, ceramic material, metal clad fiber board, and metal leadframe.

11. The method of claim 10, wherein the substrate comprises a polymer material selected from the group consisting of bismaleimide triazine resin, epoxy resin, FR-4 laminate, and FR-5 laminate.

12. The method of claim 1, further comprising, prior to positioning the die and substrate within the molding chamber:
   affixing a prefabricated object on a first surface of the die to form the standoff; and
   mounting a second surface of the die on the substrate.

13. The method of claim 12, wherein the object is affixed using an adhesive paste, a double-side adhesive tape, or a combination thereof.

14. The method of claim 12, comprising affixing an adhesively-backed object to the surface of the die.

15. The method of claim 1, wherein a second die is situated on an opposing side of the substrate.

16. The method of claim 1, further comprising, prior to positioning the die and substrate within the molding chamber:
   forming a thermally conductive material on a first surface of the die to form the standoff; and
   mounting a second surface of the die on the substrate.

17. The method of claim 1, further comprising, prior to positioning the die and substrate within the molding chamber:
   forming a plastic material directly on a first surface of the die to form the standoff; and
   mounting a second surface of the die on the substrate.

18. The method of claim 17, wherein forming the standoff comprises directly applying the plastic material onto the surface of the die by a process selected from the group consisting of injection molding, extrusion, blow molding, compression molding, transfer molding and thermoforming.

19. The method of claim 17, further comprising applying a thermally conductive material on the surface of the die adjacent to the standoff.

20. A method of fabricating a die package, comprising:
   affixing one or more standoffs on a first surface of a die, and mounting a second surface of the die on a support substrate;
   positioning the die and substrate within a molding chamber of a mold tooling comprising a pair of mold plates, with at least one standoff having a height effective to contact an inner surface of one of the mold plates during encapsulation of the die; and
   flowing a molding compound into the molding chamber to at least partially encapsulate the die, wherein the die and substrate are maintained in a substantially planar orientation within the molding chamber and only said standoff is in contact with said inner surface of one of the mold plates as the molding compound is flowed thereabout.

21. A method of fabricating a die package, comprising:
   forming one or more standoffs on a first surface of a die, and mounting a second surface of the die on a support substrate;
   positioning the die and substrate within a molding chamber of a mold tooling comprising a pair of mold plates, with at least one standoff having a height effective to contact an inner surface of one of the mold plates during encapsulation of the die; and flowing a molding compound into the molding chamber to at least partially encapsulate the die, wherein the die and substrate are maintained in a substantially planar orientation within the molding chamber and only said standoff is in contact with said inner surface of one of the mold plates as the molding compound is flowed thereabout.

22. The method of claim 21, further comprising, mounting a second die on an opposing side of the substrate.

23. A method of fabricating a die package, comprising:
positioning a die mounted on a substrate within a molding chamber of a mold tooling comprising a pair of mold plates, the die having a standoff in the form of an enclosure situated on a surface, wherein the standoff has a height effective to contact an inner surface of one of the mold plates during encapsulation of the die; and
flowing a molding compound into the molding chamber to at least partially encapsulate the die, wherein only the standoff is in contact with an inner surface of one of the mold plates as the molding compound is flowed thereabout.

24. A method of fabricating a die package, comprising:
forming a standoff in the form of an enclosure on a first surface of a die, and mounting a second surface of the die on a support substrate;
positioning the die and substrate within a molding chamber of a mold tooling comprising a pair of mold plates, wherein the standoff has a height effective to contact an inner surface of one of the mold plates during an encapsulation of the die; and
flowing a molding compound into the molding chamber to at least partially encapsulate the die, wherein only the standoff is in contact with an inner surface of one of the mold plates as the molding compound is flowed thereabout.

25. The method of claim 24, wherein applying the thermally conductive material comprises adhering a layer of copper foil to the surface of the die within the standoff enclosure.

26. A method of fabricating a die package, comprising:
flowing a molding compound into a molding chamber of a mold tooling comprising a pair of mold plates to at least partially encapsulate a die, the die mounted on a substrate and a standoff situated on the die, wherein the standoff has a height effective to contact an inner surface of one of the mold plates, the die and substrate are maintained in a substantially planar orientation within the molding chamber as the molding compound is flowed to encapsulate the die, and only the standoff is in contact with said inner surface of one of the mold plates.

27. The method of claim 26, wherein the die is flip chip mounted on the substrate.

28. The method of claim 26, wherein the support substrate is flexible.

29. A method of fabricating a die package, comprising:
flowing a molding compound into a molding chamber of a mold tooling comprising a pair of mold plates to at least partially encapsulate a die, the die mounted on a substrate and a standoff in the form of an enclosure situated on the die, wherein the standoff has a height effective to contact an inner surface of one of the mold plates, the die and substrate are maintained in a substantially planar orientation within the molding chamber as the molding compound is flowed to encapsulate the die, and only the standoff is in contact with said inner surface of one of the mold plates.

30. The method of claim 29, wherein the standoff is in the form of a dam.

31. The method of claim 30, wherein a thermally conductive material is situated on the surface of the die adjacent to the standoff.

32. The method of claim 29, wherein a thermally conductive material is situated on the surface of the die within said standoff enclosure.

* * * * *

UNITED STATES PATENT AND TRADEMARK OFFICE
CERTIFICATE OF CORRECTION

PATENT NO. : 7,501,309 B2
APPLICATION NO. : 11/511955
DATED : March 10, 2009
INVENTOR(S) : James et al.

Page 1 of 1

It is certified that error appears in the above-identified patent and that said Letters Patent is hereby corrected as shown below:

In column 10, line 18, in Claim 13, delete "double-side" and insert -- double-sided --, therefor.

Signed and Sealed this

Thirtieth Day of June, 2009

JOHN DOLL
*Acting Director of the United States Patent and Trademark Office*